United States Patent
Ladhani et al.

(10) Patent No.: US 9,484,222 B2
(45) Date of Patent: Nov. 1, 2016

(54) SEMICONDUCTOR DEVICES, SEMICONDUCTOR DEVICE PACKAGES, AND PACKAGING TECHNIQUES FOR IMPEDANCE MATCHING AND/OR LOW FREQUENCY TERMINATIONS

(71) Applicant: Freescale Semiconductor, Inc., Austin, TX (US)

(72) Inventors: Hussain H. Ladhani, Chandler, AZ (US); Lu Li, Gilbert, AZ (US); Mahesh K. Shah, Scottsdale, AZ (US); Lakshminarayan Viswanathan, Phoenix, AZ (US); Michael E. Watts, Scottsdale, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 214 days.

(21) Appl. No.: 14/184,266

(22) Filed: Feb. 19, 2014

(65) Prior Publication Data
US 2015/0235933 A1  Aug. 20, 2015

(51) Int. Cl.
| | |
|---|---|
| *H01L 23/02* | (2006.01) |
| *H01L 27/08* | (2006.01) |
| *H01L 21/48* | (2006.01) |
| *H03F 3/193* | (2006.01) |
| *H03F 3/21* | (2006.01) |
| *H01L 25/00* | (2006.01) |
| *H01L 23/66* | (2006.01) |
| *H03F 1/56* | (2006.01) |
| *H03F 3/195* | (2006.01) |

(52) U.S. Cl.
CPC .......... *H01L 21/4853* (2013.01); *H01L 23/66* (2013.01); *H01L 25/50* (2013.01); *H03F 1/565* (2013.01); *H03F 3/193* (2013.01); *H03F 3/195* (2013.01); *H03F 3/21* (2013.01); *H01L 2224/48091* (2013.01); *H01L 2224/48137* (2013.01); *H01L 2224/48247* (2013.01); *H03F 2200/423* (2013.01); *H03F 2200/451* (2013.01)

(58) Field of Classification Search
CPC ............................... H01L 23/02; H01L 27/08
USPC .......................................... 330/307; 257/678
IPC .......................................... H01L 23/02, 27/08
See application file for complete search history.

(56) References Cited

U.S. PATENT DOCUMENTS

| | | |
|---|---|---|
| 5,889,319 A | 3/1999 | Moller et al. |
| 2013/0033325 A1 | 2/2013 | Ladhani et al. |

OTHER PUBLICATIONS

Viswanathan, Lakshminarayan et al., U.S. Appl. No. 13/611,793, entitled "Semiconductor Devices with Impedance Matching-Circuits, and Methods of Manufacture Thereof", filed Sep. 12, 2012 (59 pgs.).

*Primary Examiner* — Patricia T Nguyen

(57) ABSTRACT

A semiconductor device, related package, and method of manufacturing same are disclosed. In at least one embodiment, the semiconductor device includes a radio frequency (RF) power amplifier transistor having a first port, a second port, and a third port. The semiconductor device also includes an output lead, a first output impedance matching circuit between the second port and the output lead, and a first additional circuit coupled between the output lead and a ground terminal. At least one component of the first additional circuit is formed at least in part by way of one or more of a plurality of castellations and a plurality of vias.

19 Claims, 10 Drawing Sheets

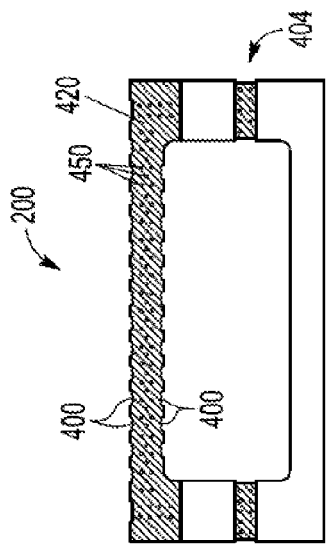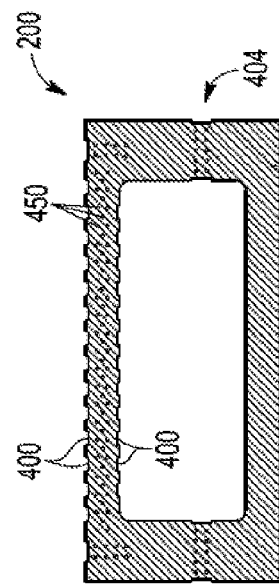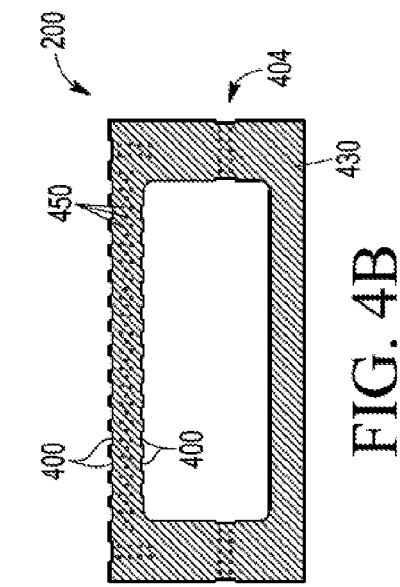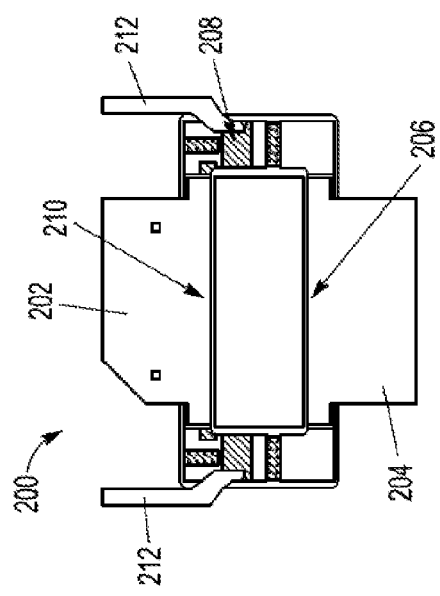

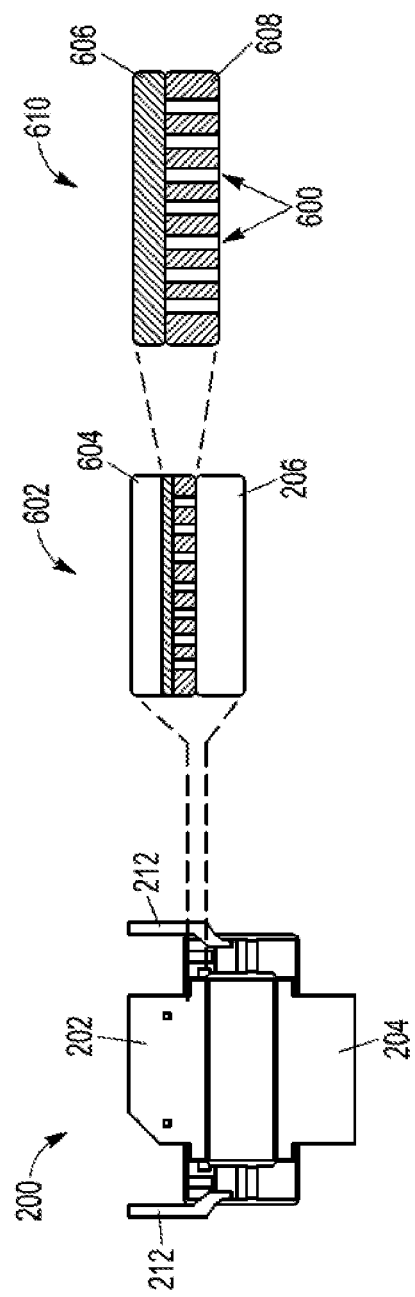

SEMICONDUCTOR DEVICES, SEMICONDUCTOR DEVICE PACKAGES, AND PACKAGING TECHNIQUES FOR IMPEDANCE MATCHING AND/OR LOW FREQUENCY TERMINATIONS

CROSS-REFERENCE TO RELATED APPLICATIONS

Not Applicable.

STATEMENT REGARDING FEDERALLY SPONSORED RESEARCH OR DEVELOPMENT

Not Applicable.

FIELD OF THE DISCLOSURE

The present disclosure relates to electrical circuit components and features and, more particularly to circuit components and features that can serve one or more of the purposes of providing impedance matching and providing low-frequency terminations (or envelope terminations).

BACKGROUND OF THE DISCLOSURE

A typical high power, radio frequency (RF) semiconductor device such as a RF power transistor may include one or more input leads, one or more output leads, one or more transistors, bondwires coupling the input lead(s) to the transistor(s), and bondwires coupling the transistor(s) to the output lead(s). The bondwires have significant reactances at high frequencies, and the associated inductances may be factored into the design of input and output impedance matching circuits for a device. In some cases, input and output impedance matching circuits may be contained within the same package that contains the device's transistor(s). More specifically, an in-package, input impedance matching circuit may be coupled between a device's input lead and a control terminal (e.g., the gate) of a transistor, and an in-package, output impedance matching circuit may be coupled between a current conducting terminal (e.g., the drain) of a transistor and a device's output lead. Each of the input and output impedance matching circuits may include one or more capacitive and resistive elements, along with the inductances inherent in the sets of bondwires interconnecting those elements with the device's transistor(s) and with the input and output leads.

Such packaged RF semiconductor devices are readily available, which have very good performance when used in narrow-band applications. However, designing suitable packaged RF semiconductor devices for wideband, multi-band, and/or multi-mode operation is challenging for several reasons. For example, in a packaged RF semiconductor device, the lead level output impedance is limited by the number of matching sections. Therefore, to achieve an acceptable lead level output impedance for a wideband, multi-band, and/or multi-mode application, it may be desirable to incorporate multiple, in-package matching sections. However, the inclusion of multiple matching sections in a device increases the number of impedance matching elements in the impedance matching circuits, and thus increases the size of the device. In addition, the various sets of bondwires that would be implemented to interconnect the impedance matching elements for multi-stage matching may create unacceptable inductive coupling between the matching sections, which may limit the effectiveness of the impedance transformation. In addition, to facilitate good performance for wideband, multi-band, and/or multi-mode implementations, relatively large discrete capacitors in the impedance matching circuits may be warranted. Accordingly, in order to accommodate the relatively large capacitors, package sizes for such implementations would need to be further increased. Increasing semiconductor device package size is incompatible with the industry trend to reduce device sizes and costs.

Indeed, one of the primary goals of any new generation of radio frequency (RF) power transistors is to achieve higher output power levels in smaller package footprints. Towards achieving this goal, the terminal impedances of the transistor tend to get lower with an increase in the transistor periphery. Relatedly, with lower terminal impedances, it becomes desirable to use multiple matching sections to raise these impedances to an acceptable level. In particular, the goal of a pre-matching network is to transform a low impedance to a level that facilitates matching on a printed circuit board (PCB) up to the system reference impedance. Additionally, the need for wide-band instantaneous operation necessitates lowering the base-band impedance seen by the power transistor. A wideband low impedance envelope termination is necessary to maintain low levels of distortion and to facilitate wideband pre-distortion linearization.

Notwithstanding such concerns, current techniques for impedance matching in the context of RF power transistors provide limited improvement with increased assembly complexity. Typically, RF power transistors use resonating inductors as the primary impedance matching element. For higher power levels a second matching section has been used for additional transformation. However, such additional matching sections add loss, manufacturing complexity and impedance dispersion across frequency, which makes such componentry difficult to use in applications such as Doherty power amplifiers. And traditionally the RF package has been an interface from the transistor to the PCB with little or no impedance transforming properties (depending on frequency). Likewise, current techniques fail to provide desired wideband low impedance envelope termination as is desirable for at least the above-discussed reasons.

BRIEF DESCRIPTION OF THE DRAWINGS

FIG. 2 is a top view of an example of a semiconductor device package structure corresponding to a first example implementation of the circuit of FIG. 1;

FIG. 3 is a top view of another example of a semiconductor device structure corresponding to a second example implementation of the circuit of FIG. 1;

FIG. 4A is a cross-sectional view of a frame structure at the level of the metallization layer between a top frame layer and a bottom frame layer of the semiconductor device structure of FIG. 2;

FIG. 4B is another cross-sectional view of the frame structure at the level of the metallization layer between the bottom frame layer and flange of the semiconductor device structure of FIG. 2;

FIG. 6 is a further top view of the semiconductor device structure of FIG. 2, further supplemented by partial exploded cross-sectional views of portions of that structure, to reveal layers in which castellations and vias are formed;

DETAILED DESCRIPTION

The present disclosure envisions that it would be advantageous if there could be developed one or more matching structures or circuits or other components, for implementation as part of or in relation to RF power transistors (e.g., as circuits, devices, or packages), to serve to improve the terminal impedances or provide desired matching characteristics and/or envelope termination characteristics that is or are simpler, and/or less expensive to implement, and/or provide more effective matching or other desired operational characteristics than conventional matching structures or circuits. The present disclosure is intended to encompass a variety of embodiments of matching structure, circuits, or other components that are configured to serve one or more purposes, including the purpose of providing significant impedance transformation and the purpose of providing an envelope termination assembly. Embodiments include semiconductor devices (e.g., radio frequency (RF) semiconductor devices) implemented using air cavity and overmolded packages. Also, in at least some embodiments, a semiconductor device includes an active device (e.g., a transistor) generally located within an "active device area" of a package, an input impedance matching circuit coupled to an input to the device, and an output impedance matching circuit coupled to the output of the device. Each of the input and output impedance matching circuits includes a plurality of impedance matching elements (e.g., inductors and capacitors). According to various embodiments, certain ones of the impedance matching elements are located outside of the active device area of the package, while still achieving the desired electrical characteristics of the input and output impedance matching circuits. Additionally, in at least some embodiments, one or more impedance matching elements are physically coupled to an isolation structure of the device. Further, at least some embodiments are air cavity package embodiments and at least some other embodiments are overmolded package embodiments. Also, although in at least some embodiments impedance matching elements of an output impedance matching circuit are positioned outside of the active portion of a package, it is to be understood that impedance matching elements of an input impedance matching circuit also can be positioned outside of the active portion of a package.

Figure 1:
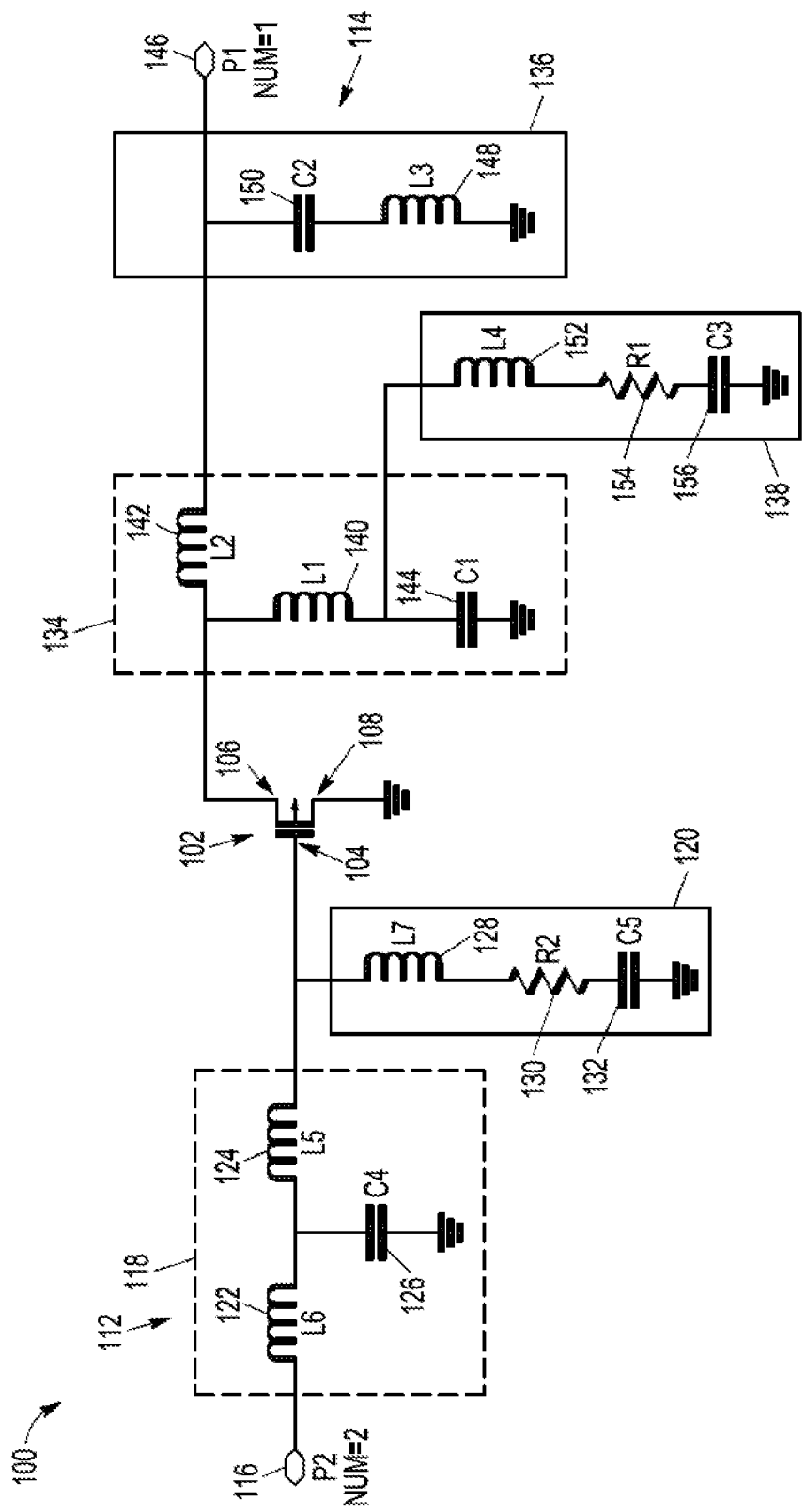
FIG. 1 is a schematic diagram showing an example circuit in accordance with one embodiment disclosed herein.

Referring to FIG. 1, a schematic diagram is provided showing a semiconductor device or circuit 100 that includes a typical radio frequency (RF) power transistor 102 (e.g., a laterally diffused metal oxide semiconductor or LDMOS transistor) with a gate port 104, a drain port 106, and a source port 108. The circuit 100 further includes gate-side circuitry 112 as well as drain-side circuitry 114, where the gate-side circuitry is coupled to the gate port 104 and the drain-side circuitry 114 is coupled to the drain port 106. The gate-side circuitry 112 particularly is shown to include an input lead 116, an input impedance matching circuit 118, and a gate-side envelope termination circuit 120. The input impedance matching circuit 118 more particularly includes first and second inductive elements (or inductors) 122 and 124, respectively, as well as a capacitor 126. Further as shown, the first and second inductive elements 122 and 124, which can be for example two sets of bondwires, are coupled in series with one another between the input lead 116 and the gate port 104, with the second inductive element 124 being coupled directly to the gate port and the first inductor 122 being coupled directly to the input lead 116. The capacitor 126 is a two terminal capacitor with one terminal coupled to the node between the first and second inductive elements 122 and 124, and the other terminal thereof being coupled to ground.

As for the gate-side envelope termination circuit 120, this circuit includes each of an inductive element (or inductor) 128, a resistor 130, and a capacitor 132, all coupled in series between the gate port 104 and ground. More particularly, the inductive element 128 is coupled between the gate port 104 and the resistor 130, the resistor 130 is coupled between the inductive element 128 and one terminal of the capacitor 132, and the other terminal of the capacitor is coupled to ground.

In contrast, the drain-side circuitry 114 includes first output impedance matching circuitry 134, a low pass matching circuit (or section) 136, a drain-side envelope termination circuit 138, and an output lead 146. More particularly, the first output impedance matching circuitry 134 includes a first inductive element (or inductor) 140, a second inductive element (or inductor) 142, and a capacitor 144. As shown, the first inductive element 140 and the capacitor 144 are coupled in series between the drain port 106 and the ground, with the first inductive element (which can again be a set of bondwires) being coupled between the drain port 106 and one terminal of the capacitor 144, and the other terminal of the capacitor being coupled to ground. The inductive element 140 and the capacitor 144 function as a high-pass matching circuit, with the inductive element providing a shunt inductance and the capacitor in at least some embodiments being a dc (direct current) blocking capacitor. With respect to the second inductive element 142, this inductive element is coupled between the drain port 106 (as well as the first inductive element 140) and each of the output lead 146 and the matching circuit 136.

Further, with respect to the matching circuit 136, that circuit includes an inductive element (or inductor) 148 and a capacitor 150 that are coupled in series between the output lead 146 (and also therefore to the inductive element 142) and ground, with the inductive element 148 being coupled between ground and one terminal of the capacitor 150, and the other terminal of the capacitor 150 being coupled to the output lead 146. As for the drain-side envelope termination circuit 138, this circuit includes a further inductive element (or inductor) 152, a resistor 154, and a capacitor 156 all coupled in series between the node between the first inductive element 140 and the capacitor 144 and ground. More particularly, the further inductive element 152 is coupled between the resistor 154 and the node linking the capacitor 144 with the first inductive element 140, the resistor 154 is coupled between the further inductive element 152 and one terminal of the capacitor 156, and the other terminal of the capacitor is coupled to ground.

The various components of the circuit 100 as shown in FIG. 1 in at least some embodiments can all be incorporated into a single package, with the RF power transistor 102 particularly being positioned within an active device area of the packaged device. In order to reduce package size in particular embodiments, certain elements of the impedance matching circuits (e.g., the input impedance matching circuit 118 and the first output matching impedance circuitry 134) are integrated into the active device area of the packaged device, which enables relatively-small packaged devices with multi-stage matching to be produced. In addition, in certain embodiments, some elements of the impedance matching circuits are electrically coupled to other device elements using conductive interconnects other than bondwires, which can reduce manufacturing complexity and/or device cost.

Depending upon the embodiment, implementation of the circuit 100 of FIG. 1 can take a variety of forms. Referring to FIGS. 2 and 3, top plan views are provided of a first example structure 200 and a second example structure 300 that can each serve as an implementation of the packaging for circuit 100. The structure 200 includes an input lead 204 corresponding to the input lead 116 of FIG. 1, an output lead 202 corresponding to the output lead 146 of FIG. 1, other leads 212 (for connections for biasing and other functions), as well as other portions corresponding to the components forming the circuit 100 of FIG. 1, and all of the portions of the structure 200 can be packaged together. Additionally, the structure 200 includes a flange portion 206 with a rigid electrically-conductive substrate, which has a thickness that is sufficient to provide structural support for other components and elements of the structure 200. In addition, the flange portion 206 can function as a heat sink for the RF power transistor 102 and other circuit components mounted on the flange 206. Various components and elements can have terminals that are electrically coupled to flange 206, and the flange 206 can be electrically coupled to a system ground. The flange 206 can more generally be referred to as a substrate with a conductive surface, and at least the surface of the flange 206 is formed from a layer of conductive material, and possibly all of flange 206 is formed from bulk conductive material.

In addition to the above-described features, the first example structure 200 of FIG. 2 also includes a non-conductive frame structure that supports the input and output leads 204, 202 above the flange portion 206. Although this non-conductive frame structure is substantially obscured in the view of FIG. 2, this non-conductive frame structure is shown in multiple cross-sections provided in FIGS. 4A and 4B. As illustrated in FIGS. 4A and 4B (and as described further below), in the present embodiment, the non-conductive frame structure can have a "window frame" shape. In other embodiments, the frame structure can have other shapes. As will also be described in more detail below, conductive vias and/or castellations can be formed in a portion of the frame structure that underlies the output lead to provide a low inductance path to ground (e.g., to the flange portion 206). The frame structure provides for isolation between the flange 206 and the input and output leads 204, 202, and therefore can be referred to alternatively as an "isolation structure" herein.

Among the various components of the circuit 100 that are present in the structure 200, FIG. 2 particularly shows a drain-side envelope termination circuit portion 208 that corresponds to the drain-side envelope termination circuit 138 of the circuit as shown in FIG. 1. Additionally, the structure 200 also includes a matching section 210 that corresponds to the matching circuit 136 of the circuit 100 as shown in FIG. 1. Accordingly, it should be particularly appreciated that the implementation represented by the structure 200 provides higher package capacitance at the output (e.g., the output lead 202), which is tunable using external capacitors, as well as provides drain side envelope termination capability, using external high value ceramic capacitors. Additionally, implementation of the structure 200 (including by way of external capacitors as mentioned above) is advantageous in that low-price off-the-shelf components (capacitors) can be employed.

As for the second example structure 300 of FIG. 3, that structure also includes an input lead 304 corresponding to the input lead 116 of FIG. 1, an output lead 302 corresponding to the output lead 146 of FIG. 1, other leads 312 (for connections for biasing and other functions), as well as other portions corresponding to all of the components forming the circuit 100 of FIG. 1, and all of the portions of the structure 300 can be packaged together. Additionally, similar to the structure 200, the structure 300 includes a flange portion 306 with a rigid electrically-conductive substrate, which has a thickness that is sufficient to provide structural support for other components and elements of the structure 300. Again, the flange portion 306 can function as a heat sink for the RF power transistor 102 and other circuit components mounted on the flange portion 306, various components and elements can have terminals that are electrically coupled to flange portion 306, the flange portion 306 can be electrically coupled to a system ground (or ground plane), and the flange portion 306 can more generally be referred to as a substrate with a conductive surface, with at least the surface of the flange portion 306 being formed from a layer of conductive material (and possibly all of flange portion 306 is formed from bulk conductive material).

As with respect to the structure 200, the structure 300 also includes a non-conductive frame structure that supports the input and output leads 304, 302 above the flange 306. Although this non-conductive frame structure is substantially obscured in the view of FIG. 3, and although FIGS. 4A and 4B are (as already mentioned above) described as pertaining particularly to the structure 200, it should be understood that the non-conductive frame structure present in the structure 300 can also take the same form as shown in the multiple cross-sections of FIGS. 4A and 4B (that is, FIGS. 4A and 4B can be understood to be equally pertinent to the non-conductive frame structure of the structure 200 and the non-conductive frame structure of the structure 300). Therefore, as illustrated in FIGS. 4A and 4B and described further below, the non-conductive frame structure of the structure 300 can have a "window frame" shape, although it can have other shapes as well. Also, as will be described in more detail later (and as is the case for both the structure 200 and the structure 300), conductive vias and/or castellations can be formed in a portion of the frame structure that underlies the output lead to provide a low inductance path to ground (e.g., to the flange 306).

Among the various components of the circuit 100 that are present in the structure 300, FIG. 3 particularly shows a drain-side envelope termination circuit portion 308 that corresponds to the drain-side envelope termination circuit 138 of the circuit as shown in FIG. 1. Additionally, the structure 300 also includes a gate-side envelope termination circuit portion 310 that corresponds to the gate-side envelope termination circuit 120 of FIG. 1. With these features, it should be particularly appreciated that the implementation represented by the structure 300 provides higher package capacitance (fixed) with drain and gate side envelope termination capability (using external capacitors). That is, this implementation of FIG. 3 allows for two different types of envelope termination circuits (both input and output) to be present.

Turning to FIGS. 4A, 4B, 5A, 5B, and 6, it should further be appreciated that, in at least some embodiments of the circuit 100, including the implementations (embodiments) shown in FIGS. 2 and 3, castellations and/or via holes are provided in the frame structure to allow for a low-inductance path between the output leads (e.g., the output leads 202, 302 of FIGS. 2 and 3) and ground (e.g., the flange portions 206 and 306 of FIGS. 2 and 3). According to at least one embodiment, the frame structure also is configured to provide capacitance between the respective output lead and ground in series with the low-inductance path. Increasing the package capacitance has been shown (through simulations) to directly impact (enhance) impedance transformation with no degradation in performance, and lowering the inductance may directly impact baseband impedance resonant frequency.

FIG. 4A particularly provides a first cross-sectional view (e.g., between layers 606 and 608 of FIG. 6 described further below) of an embodiment of a frame structure 404 of the structure 200 (FIG. 2) showing, among other things, a conductive layer 420 (e.g., an internal metallization layer 1208 of FIG. 12 described further below) and overlying and interconnecting castellations 400 and via holes 450 in the frame structure 404. FIG. 4B particularly provides a second cross-sectional view (e.g., at the bottom of the layer 608 of FIG. 6) of the frame structure 404 of the structure 200 also showing, among other things, a bottom conductive layer 430 and interconnecting castellations 400 and via holes 450 in the frame structure 404.

Figure 5B:
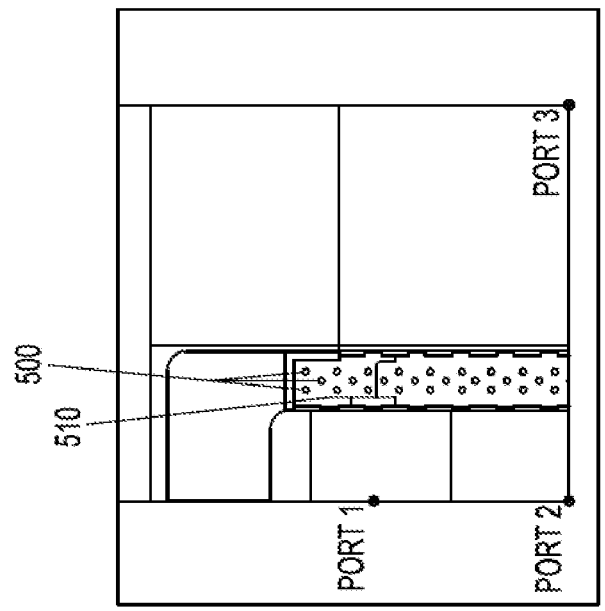
FIGS. 5A and 5B are respectively a three-dimensional, partly phantom and a cutaway top view of portions of a frame structure in which there are provided castellations and vias.
Figure 5A:
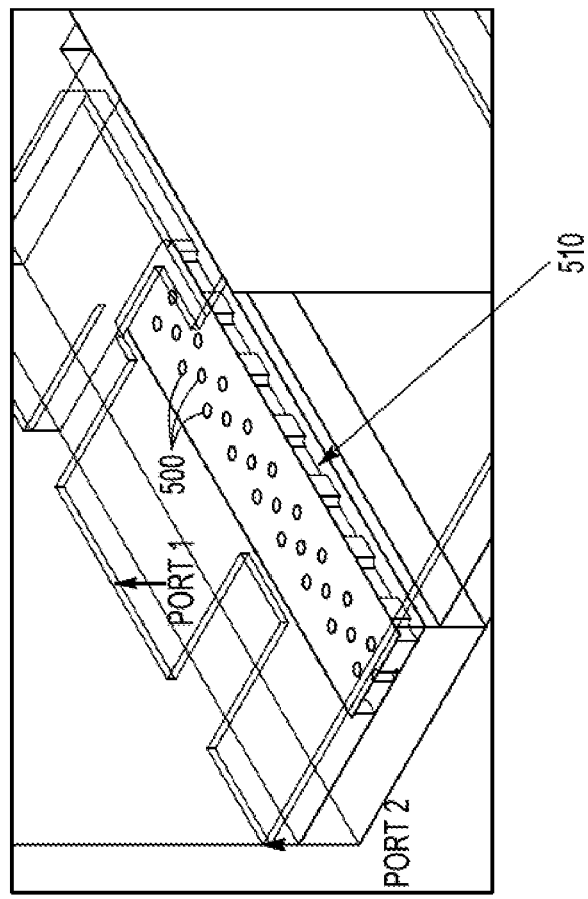

FIG. 5A and FIG. 5B additionally show castellations 510 and via holes 500, with FIG. 5A showing the castellations 510 and via holes 500 in a perspective cutaway view and FIG. 5B showing the same castellations 510 and via holes 500 from a top plan view (FIGS. 5A and 5B can be considered to be pertinent to the frame structure 404 of FIGS. 4A and 4B). It should be understood that via holes are tubular features having defined walls except at the ends of the holes, and in contrast castellations are indentations or partly-tubular features extending along the edges of the structure into which the castellations are formed. That is, the castellations have only partly-defined (rather than fully-defined) sidewalls along their lengths between their ends, while via holes have fully-defined sidewalls along their entire lengths between their ends. In either case, as used herein, the terms "via holes" (or "vias") and "castellations" refer to features that are filled with conductive material to provide for electrical conductivity between top and bottom surfaces of the structures in which they are formed.

FIG. 6 particularly illustrates in additional detail castellations 600 formed in a frame structure 610 in relation to the structure 200 of FIG. 2. As shown, the castellations 600 particularly are provided in the portion of the frame structure 610 underlying the output lead 202 of the structure 200. A cross-sectional, side-view of a portion 602 of the structure 200 reveals a layered arrangement, in which the output lead (plus brazed metal) 202 forms a first layer 604 that is above a second layer 606 that is a first insulating layer (e.g., a ceramic layer, a layer of organic PCB material, etc.) of the frame structure 610. The second layer 606 in turn is situated above a third layer 608 that is a second insulating layer (e.g., a second ceramic layer or layer of organic PCB material) of the frame structure 610, and the third layer 608 is in turn situated above the flange portion 206, which is a package flange and can serve as the ground terminal. It is particularly within the second insulating layer formed by the third layer 608 that the castellations 600 (plus vias, in at least one embodiment) are formed. In the present embodiment, the second layer 606 (first insulating layer) may be about 6 mils thick and the third layer 608 (second insulating layer) may be about 14 mils thick, although the layers 606, 608 may be thicker or thinner in other embodiments. This arrangement shown in FIG. 6 effectively thins the insulating portion of the frame structure 610 down to about 6 mils and the vias (metallization holes) plus the castellations 600 allow for a low inductance path between the bottom of the second layer 606 and the flange portion 206.

It should be further appreciated that, in terms of the correspondence between the structures shown in FIG. 6 and the circuit 100 shown in FIG. 1, the castellations 600 (as well as any vias such as the vias 500 of FIG. 5, as are present in addition to the castellations in at least some embodiments) correspond to the inductor 148 of FIG. 1, and the second layer 606 (first insulating layer) corresponds to the dielectric of the capacitor 150 of FIG. 1. Also, although ceramic is used in the present embodiment to form the frame structure 610 in which the castellations 600 (plus any additional vias in at least some embodiments) are formed, in other embodiments, other materials can be used, including for example, organic board (dielectric).

Figure 7:
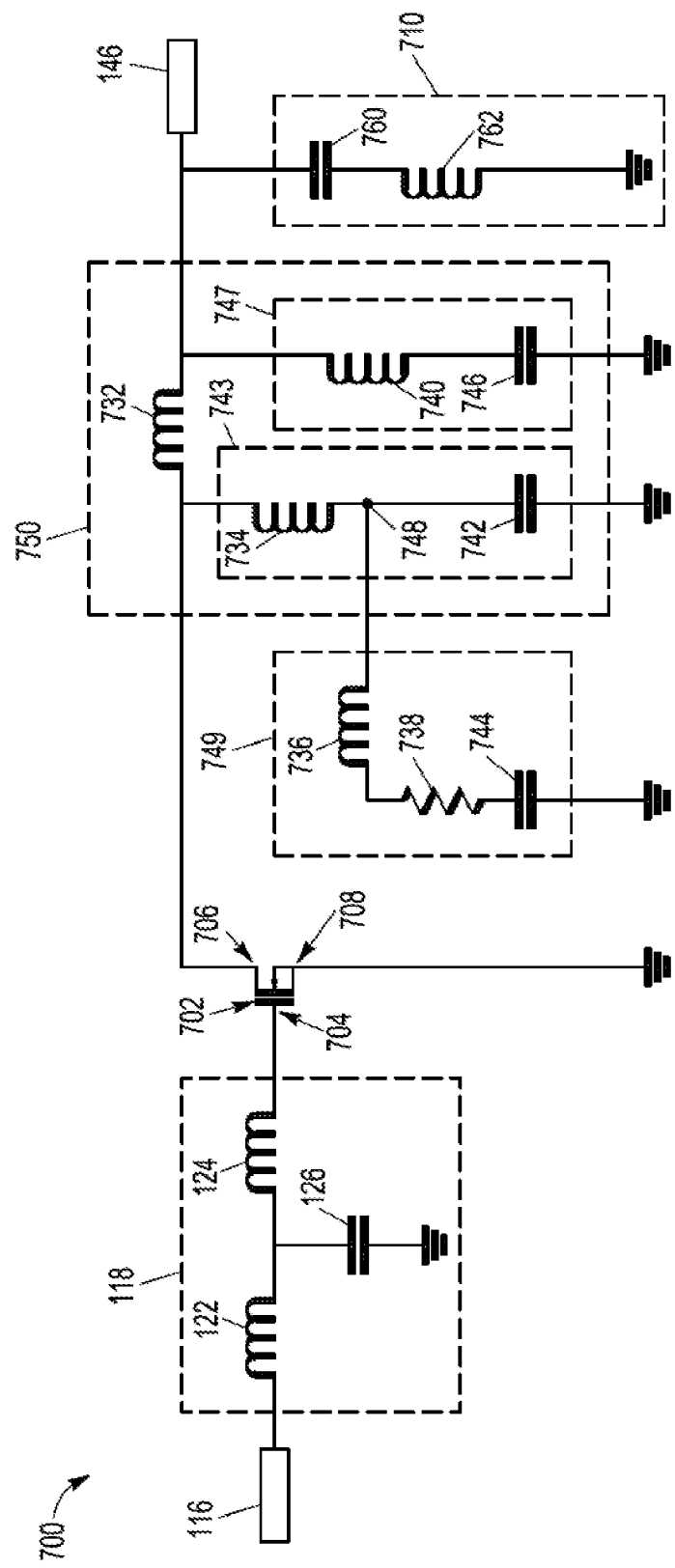
FIG. 7 is a schematic diagram showing an additional example circuit in accordance with one embodiment disclosed herein.

Referring now to FIG. 7, an additional schematic diagram is provided showing a semiconductor device or circuit 700 in accordance with another embodiment of the present disclosure. As with the circuit 100 of FIG. 1, the circuit 700 of FIG. 7 includes a transistor 702 that is the primary active component of the circuit and that includes a first port 704, a second port 706, and a third port 708. The first port 704 can be considered a control terminal, while the second and third ports 706 and 708 can be considered current conducting terminals (or ports), where the current conducting terminals are spatially and electrically separated by a variable-conductive channel. In the present example, the transistor 702 can be a field-effect-transistor (FET) such as a metal-oxide-semiconductor field-effect-transistor (MOSFET). In such embodiment, the first port 704 is a gate terminal (or port) and constitutes the aforementioned control terminal, the second port 706 is a drain terminal (or port) that constitutes a first current conducting terminal, and the third port 708 is a source terminal (or port) that constitutes a second current conducting terminal. Alternatively, the transistor 702 can take other forms such as that of a bipolar junction transistor (BJT), as could also be the case with respect to the transistor 102 of FIG. 1. Accordingly, any references herein to a "gate", "drain", and "source" are not intended to be limiting, as each of these designations are intended to be representative of analogous or counterpart features associated with other types of transistor devices (e.g., the "base", "collector", and "emitter" features of a BJT).

As with respect to the circuit 100 of FIG. 1, the third port 708 of the transistor 702 is coupled to a ground terminal. Additionally, the circuit 700 includes the input lead 116 and the input impedance matching circuit 118, with the input impedance matching circuit 118 being coupled between the input lead 116 and the first port 704 of the transistor 702. It should be appreciated that the input impedance matching circuit 118 is configured to raise the impedance of the transistor 700 to a higher (e.g., intermediate or higher) impedance level (e.g., in a range that would ease impedance matching on the PCB). This is advantageous in that it allows the PCB-level matching interface from a driver stage to have an impedance that can be achieved in high-volume manufacturing with minimal loss and variation (e.g., a "user friendly" matching interface). It should also be appreciated that the combination of inductive elements 122, 124 and shunt capacitor 126 functions as a low-pass filter. According to an embodiment, the series combination of inductive elements 122, 124 can have a value in a range between about 50 picohenries (pH) to about 3 nanohenries (nH), and shunt capacitor 126 can have a value in a range between about 5 picofarads (pF) to about 80 pF.

In addition, the circuit 700 further includes the output lead 146 of the circuit 100 and further circuitry coupled between that output lead and the second port (drain port) 706 of the transistor 702, where the further circuitry particularly includes an output impedance matching circuit 750, an envelope termination circuit 749, and a terminal impedance matching circuit 710. The output impedance matching circuit 750 is configured to match the output impedance of device 700 with the input impedance of an external circuit or component (not shown) that can be coupled to output lead 146. In the present embodiment, the output impedance matching circuit 750 includes first, second, and third inductive elements (or inductors) 732, 734, and 740, respectively, (e.g., three sets of bondwires) and first and second capacitors 742 and 746, respectively.

The first inductive element 732, which can be referred to herein as a "series inductor," is coupled between the second port 706 of the transistor 702 (e.g., the first current conducting terminal of the transistor or drain of the transistor) and the output lead 146. The second inductive element 734, which can be referred to herein as a "shunt inductor," is coupled between the second port 706 of the transistor 702 and a first terminal of the first capacitor 742, which can be referred to herein as a "shunt capacitor." Finally, the third inductive element 740, which can be referred to herein as a "low-pass matching inductor," is coupled between the output lead 146 and a first terminal of the second capacitor 746, which can be referred to herein as a "low-pass matching capacitor." Second terminals of the shunt and low-pass matching capacitors 742 and 746 (as well as a capacitor 744 further described below) are coupled to ground, in the present embodiment. Additionally as shown, the shunt inductor 734 and shunt capacitor 742 are coupled in series between the second port 706 (first current conducting terminal) of the transistor 702 and ground, and this combination of impedance matching elements functions as a first (high-pass) matching stage. Accordingly, the combination of the shunt inductor 734 and shunt capacitor 742 can be referred to herein as a high-pass matching circuit 743. In one example embodiment, the shunt inductor 734 can have a value in a range between about 100 picohenries (pH) to about 3 nanohenries (nH), and the shunt capacitor 742 can have a value in a range between about 50 pF to about 500 pF, although these components can have values outside of these ranges, as well.

It should additionally be appreciated that an RF "cold point" is present at a node 748 between shunt inductor 734 and shunt capacitor 742, where the RF cold point represents a high impedance point in the circuit. The envelope frequency termination circuit 749 is coupled between the RF cold point (at the node 748) and ground. The envelope frequency termination circuit 749 functions to increase the drain-side low frequency resonance of the circuit 700 caused by the interaction between the output impedance matching circuit 750 and external bias feeds The envelope frequency termination circuit 749 is designed to be "invisible" from an RF impedance matching standpoint, as it only effects the output impedance at envelope frequencies (e.g., the envelope frequency termination circuit 749 provides terminations for the envelope frequencies of the circuit 700).

In the present embodiment, the envelope frequency termination circuit 749 includes an inductive element (or inductor, which can be a set of bondwires) 736, a resistor 738, and the capacitor 744, which are all coupled in series. The inductive element 736, which can be referred to herein as an "envelope inductor," is coupled between the node 748 (or the first terminal of the shunt capacitor 742) and a first terminal of the resistor 738, which can be referred to herein as an "envelope resistor." A second terminal of the resistor 738 is coupled to a first terminal of the capacitor 744, which can be referred to herein as an "envelope capacitor." A second terminal of the capacitor 744 is coupled to ground, in the present embodiment. Also, in at least one such embodiment, the envelope inductor 736 can have a value in a range between about 5 pH to about 500 pH, the envelope resistor 738 can have a value in a range between about 0.1 Ohm to about 2 Ohm, and the envelope capacitor 744 can have a value in a range between about 10 nanofarads (nF) to about 10 microfarads (μF), although these components can have values outside of these ranges, as well.

Additionally it should be appreciated that the low-pass matching inductor 740 and low-pass matching capacitor 746 are coupled in series between the output lead 146 and ground, and this combination of impedance matching elements functions as a second (low-pass) matching stage. Accordingly, the combination of the low-pass matching inductor 740 and low-pass matching capacitor 746 can be referred to herein as a low-pass matching circuit 747. In at least one such embodiment, the low-pass matching inductor 740 can have a value in a range between about 50 pH to about 1 nH, and the low-pass matching capacitor 746 can have a value in a range between about 1 pF to about 50 pF, although these components can have values outside of these ranges, as well. Further it should be appreciated that the low-pass matching circuit 747, including the low-pass matching inductor 740 and the low-pass matching capacitor 746, form a part of the output network. In addition to providing an impedance matching function, the low-pass matching circuit provides feedback to the input of the power transistor, through mutual inductance coupling with inductances provided by the inductive elements 122 and 124 of the input impedance matching circuit 118. This mutual coupling serves to improve RF performance through increased gain, better isolation and better stability in operation of the transistor (e.g., FET) 702.

That said, in at least some alternate embodiments, the low-pass matching circuit 747 would include only the low-pass matching capacitor 746, as the low-pass matching inductor 740 is not a particularly desirable element in some circumstances. For example, because undesirable inductive coupling can be present between the low-pass matching inductor 740 and other inductive elements of the system (e.g., the series inductor 732 and the shunt inductor 734), due to the relatively close physical proximity of these inductive elements, and because this inductive coupling can cause undesirable loss and sub-optimal impedance transformation in the output impedance matching circuit 750, in some embodiments, the low-pass matching inductor 740 can be eliminated. However, the low-pass matching inductor 740 is included in the low-pass matching circuit 747, in some embodiments such as that of FIG. 7, so as to allow for a distinct electrical connection to be established between the output lead 146 and the low-pass matching capacitor 746. The low-pass matching inductor 740 represents that electrical connection (e.g., the low-pass matching inductor 740 can be implemented as a plurality of bondwires between the output lead 146 and the low-pass matching capacitor 746). To achieve desired performance, the output impedance matching circuit 750 should be designed to compensate for the inductance of the low-pass matching inductor 740, even though such compensation can have other drawbacks (e.g., an increased size of the low-pass matching capacitor 746).

In addition to the above circuit components, as already mentioned, the circuit 700 of FIG. 7 additionally also includes the terminal impedance matching circuit 710. As shown, the terminal impedance matching circuit 710 includes an additional capacitor 760 and additional inductive element (or inductor) 762 that are coupled in series between the output lead 146 and the ground terminal, with a first terminal of the capacitor 760 particularly being coupled to the output lead 146 and a first terminal of the inductive element 762 being coupled to the ground terminal and the second terminals of each of the capacitor 760 and inductive element 762 being coupled together. It should be understood that the terminal impedance matching circuit 710 as shown in FIG. 7 can be considered a representation of an equivalent circuit for a package capacitor (the additional capacitor 760) and inductance (associated with the additional inductive element 762) achieved due to vias and castellations (as discussed further below). In the present embodiment, the additional capacitor 760 is designed to be of high value (e.g., about 16 pF at 1 MHz, although it could have higher or lower capacitance) and high self resonant frequency by the use of low inductance provided through edge plated castellations and via holes in the frame structure (e.g., the ceramic frame). The primary function of the terminal impedance matching circuit 710 is to improve the terminal impedances of the transistor (e.g., FET) 702, which may result in better impedance matching on the printed circuit board (PCB) to which the device is mounted.

As with the circuit 100 of FIG. 1, the components of the circuit 700 including the input lead 116, the input impedance matching circuit 118, the transistor 702, the output impedance matching circuit 750, and the output lead 146 can all be incorporated into a single package, where the transistor is positioned within an active device area of the packaged device. However, in order to reduce package size in particular embodiments, certain elements of the impedance matching circuits are positioned away from the active device area of the packaged device, which enables relatively-small packaged devices with multi-stage matching to be produced. In addition, in certain embodiments, some elements of the impedance matching circuits are electrically coupled to other device elements using conductive interconnects other than bondwires, which can reduce manufacturing complexity and/or device cost.

Figure 8:
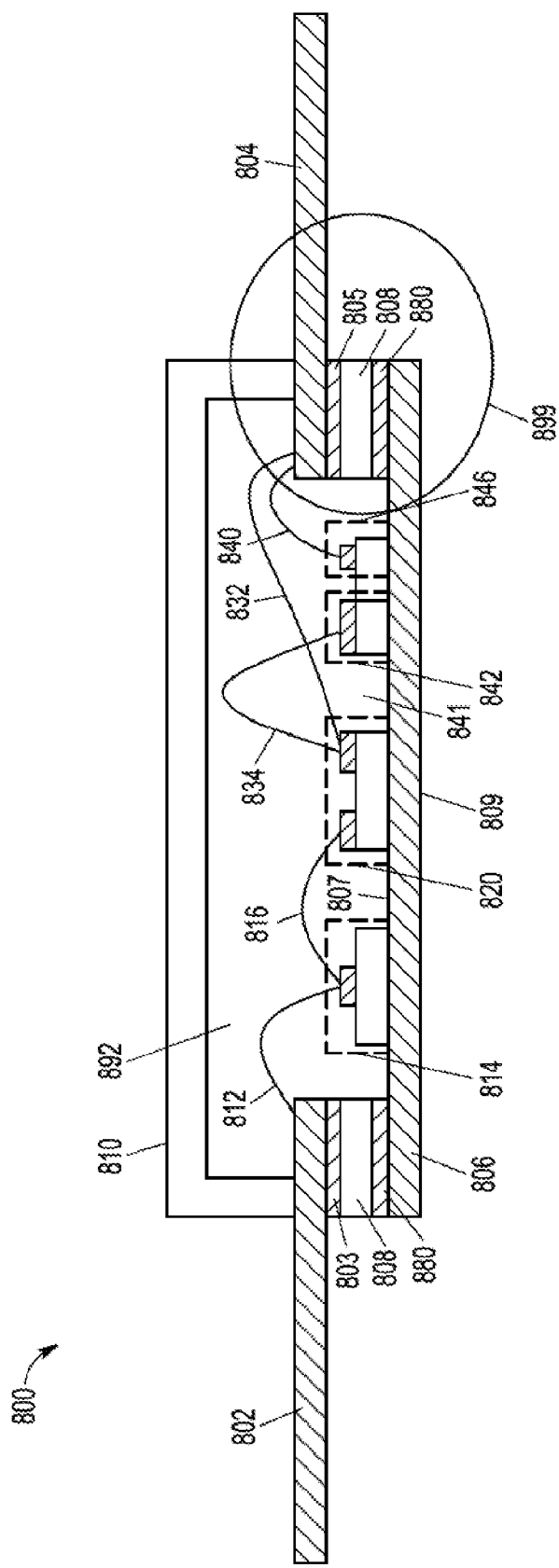
FIG. 8 is a cross-sectional, side view of a semiconductor device structure that can form the circuit shown in FIG. 7.

Turning to FIG. 8, a cross-sectional side view of a semiconductor device 800 having electrical components in accordance with the circuit 700 of FIG. 7 is provided. FIG. 8 particularly is a cross-sectional view through input and output lead structures (corresponding to the input and output leads 116, 146 of the circuit 700) and the active device area. As shown, the device 800 particularly includes an input lead structure 802 (corresponding to the input lead 116 of FIG. 7), an output lead structure 804 (corresponding to the output lead 146 of FIG. 1), a flange 806, an isolation structure 808, and a transistor 820 (corresponding to the transistor 702 of FIG. 7). The device 800 further includes structures corresponding to the input impedance matching circuit 118, an envelope frequency termination circuit 749, and output impedance matching circuit 750 of FIG. 7, all of which can be packaged together as parts of the device. In the example of FIG. 8, the device 800 includes the transistor 820, although in other embodiments the semiconductor device can include two or more transistors that essentially function in parallel, as well. In addition, the device 800 also includes an input capacitor 814, a shunt capacitor 842, an envelope capacitor (not shown in FIG. 8), and a plurality of low-pass matching capacitors (also not shown in FIG. 8). It is to be understood that more of each of the types of capacitors can be implemented depending upon the embodiment. Although not shown, it can be appreciated that in at least some embodiments, jumper wires can be electrically coupled between multiple ones of the transistors, input capacitors, and shunt capacitors, in order to provide low frequency paths between corresponding components.

Additionally, FIG. 8 illustrates a cap 810, which can be implemented in air cavity package embodiments to seal the interior components of device 800 within an air cavity 892. In at least one embodiment, the device 800 is incorporated in the air cavity package, so that the transistor(s) 820 and various impedance matching elements 812, 814, 816, 832, 834, 840, and 842 are located within the enclosed air cavity 892. In addition, impedance matching elements (not shown) can also be located within the air cavity 892 in the embodiment illustrated in FIG. 8, although in other embodiments such elements can be located outside of the air cavity. Basically, the air cavity 892 is bounded by the flange 806, isolation structure 808, and the cap 810 overlying and in contact with the isolation structure 808 and lead structures 802, 804. In some alternate embodiments, a semiconductor device can be incorporated into an overmolded package (i.e., a package in which at least the transistors 820 and other electrical components within the active device area are encompassed by a non-conductive molding compound, and in which portions of the lead structures 802, 804, and all or portions of the isolation structure 808 and elements outside of the active device area also can be encompassed by the molding compound.

The flange 806 includes a rigid electrically-conductive substrate, which has a thickness that is sufficient to provide structural support for other components and elements of device 800. In addition, the flange 806 can function as a heat sink for the transistors 820 and other devices mounted on the flange. Also, in the present embodiment the flange 806 has a top surface 807 and a bottom surface 809 and (although not entirely evident from FIG. 8) a substantially-rectangular perimeter that corresponds to the perimeter of the device 800. The flange 806 is formed from a conductive material, and can be used to provide a ground reference for the device 800. For example, various components and elements can have terminals that are electrically coupled to flange 806, and flange 806 can be electrically coupled to a system ground when the device 800 is incorporated into a larger electrical system.

In the present embodiment, the isolation structure 808 is attached to the top surface 807 of the flange 806. As shown, the isolation structure 808 includes a layer of metallization 880 on its bottom surface, which can be soldered to or otherwise attached to the top surface 807 of the flange 806, as well as metallization 803, 805 along its top surface. The isolation structure 808 is formed from a rigid, electrically insulating material (e.g., a material with a dielectric constant in a range from about 3.0 to about 10.0, although materials with higher or lower dielectric constants can be used), and has a top surface and an opposed bottom surface. For example, the isolation structure 808 can be formed from inorganic materials (e.g., ceramic such as aluminum oxide, aluminum nitride, and so on) and/or organic materials (e.g., one or more polymers or PCB materials). In an embodiment in which the isolation structure 808 comprises PCB materials (e.g., the isolation structure 808 essentially includes a single or multi-layer PCB), conductive layers (e.g., copper layers) can be included on the top and bottom surfaces of the isolation structure 808. In a further embodiment, a conductive layer on the top surface of the isolation structure 808 can be patterned and etched to form a leadframe for the device 800, and a conductive layer on the bottom surface of the isolation structure 808 can be coupled to the flange 806.

Figure 12:
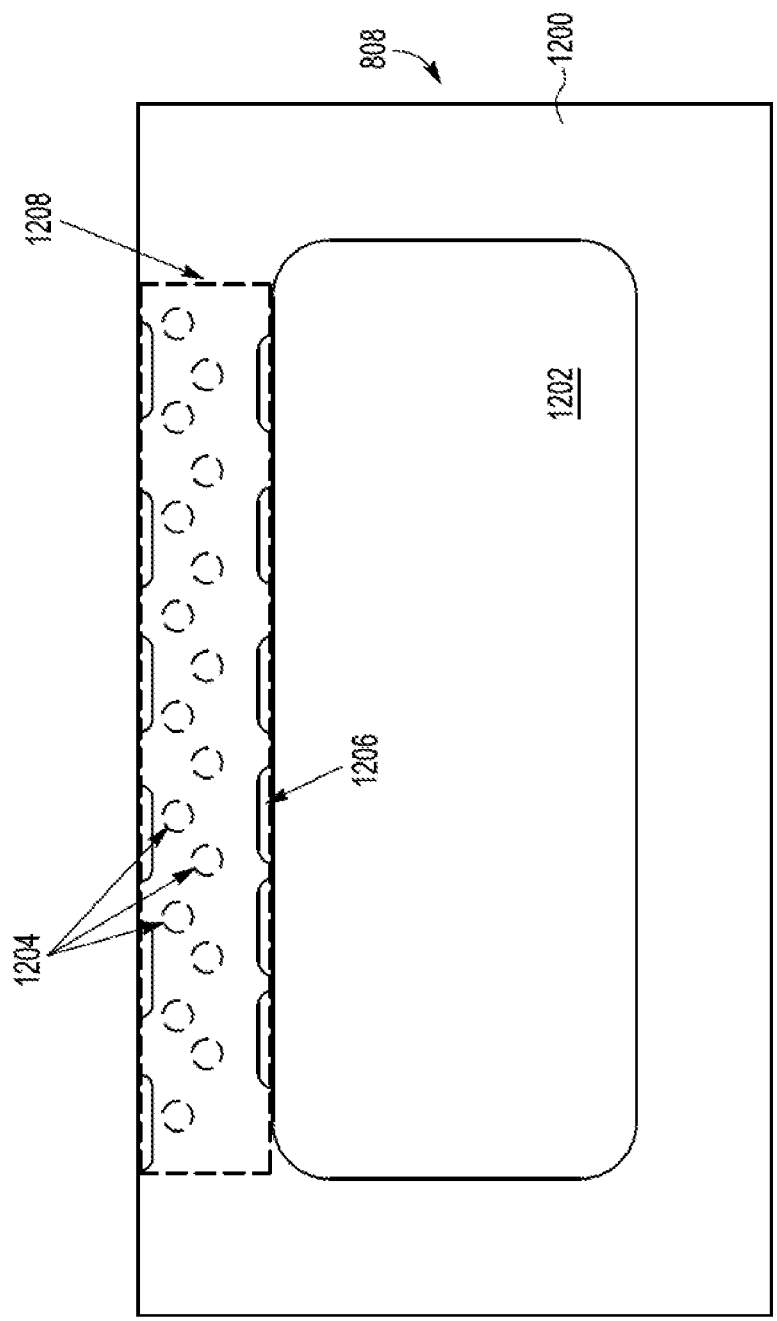
FIG. 12 illustrates a further cross-sectional view of the semiconductor device structure of FIG. 8 to further show an example arrangement of castellations and/or vias.

Referring still to FIG. 8 and additionally to FIG. 12, in at least some embodiments including the present embodiment, the isolation structure 808 has a frame shape that includes a substantially enclosed, four-sided structure 1200 with a central opening 1202. Although the isolation structure 808 can have a substantially rectangular shape as shown, it can also take on other shapes (e.g., annular ring, oval, and so on) in other embodiments. Further, the isolation structure 808 can be formed as a single, integral structure, or formed as a combination of multiple members. For example, in an alternate embodiment, isolation structure 808 can include multiple portions that contact each other or that are spatially separated from each other (e.g., the isolation structure 808 can have one portion isolating the input lead structure 802 from the flange 806, and another portion isolating the output lead structure 804 from the flange 806). In addition, depending upon the embodiment, the isolation structure 808 can be formed from a homogenous material, or the isolation structure 808 can be formed from multiple layers. It should further be evident from FIGS. 8 and 12 that the input and output lead structures 802, 804 are mounted on atop surface of the isolation structure 808 on opposed sides of the central opening 1202, and thus the input and output lead structures 802, 804 are elevated above the top surface of the flange 806, and are electrically isolated from the flange 806. For example, the input and output lead structures 802, 804 can be soldered or otherwise attached to metallization 803, 805 on a top surface of the isolation structure 808. The metallization 803, 805 can be considered to be conductive pads to which the input and output lead structures 802, 804 are coupled. Generally, the input and output lead structures 802, 804 are oriented in order to allow for attachment of bondwires (e.g., bondwires 812, 832, 840) between the input and output lead structures 802, 804 and components and elements within the central opening 1202 of isolation structure 808.

Still referring to FIG. 8, the transistor structure 820 and various elements of the input and output impedance matching circuits are mounted on a generally central portion of the top surface 807 of the flange 806 that is exposed through the opening in the isolation structure 808. According to at least one embodiment, the transistor structure 820 is positioned within the active device area of the device 800, along with impedance matching elements 814, 842, 846. As already discussed in regard to the transistor 702 of FIG. 7, the transistor structure 820 of FIG. 8 has a control terminal (e.g., a gate) and two current conducting terminals (e.g., a drain and a source). The control terminal of transistor structure 820 is coupled to the input impedance matching circuit via the bondwires 816 between the input capacitor 814 and the transistor structure 820. In addition, one current conducting terminal (e.g., the drain) is coupled to the output impedance matching circuit via the bondwires 834 between the transistor structure 820 and the capacitor 842, and coupled to the output lead structure 804 via the bondwires 832 between the transistor structure 820 and the output lead structure 804. The other current conducting terminal (e.g., the source) is coupled to the flange 806 (e.g., to ground), in at least one embodiment.

Although not shown in FIG. 8, it should also be understood that the input impedance matching circuit 118 of FIG. 7 is coupled between the input lead structure 802 and the control terminal of the transistor structure 820. That said, FIG. 8 does show the elements 812, 816 that can be considered to correspond to the inductive elements 122 and 124 of FIG. 7 and the capacitor 814 that can be considered to correspond to the capacitor 126 of FIG. 7. Each of the elements 812, 816 is formed from a plurality of parallel, closely-spaced sets of bondwires, and the capacitor 814 can be, for example, a discrete silicon capacitor, a discrete ceramic capacitor, or another type of capacitor. The bondwires 812, 816 are attached to a conductive top plate at the top surface of capacitor 814. Further it should be appreciated that the output impedance matching circuit 750 of FIG. 7 is coupled between a first current conducting terminal (e.g., drain) of the transistor structure 820 and the output lead structure 804, and the output impedance matching circuit includes three inductive elements 832, 834, 840 (corresponding to the inductive elements 732, 734, and 740 of FIG. 7) and two capacitors 842 and 846 (corresponding to the capacitors 742 and 746 of FIG. 1).

Again, each of the inductive elements 832, 834, and 840 is formed from a plurality of parallel, closely-spaced sets of bondwires. For example, a series inductive element 832 (e.g., corresponding to the inductive element 732 of FIG. 7) includes a plurality of bondwires coupled between the first current conducting terminal (e.g., the drain) of the transistor 820 and the output lead structure 804. A shunt inductive element 834 (corresponding to the shunt inductive element 734 of FIG. 7) includes a plurality of bondwires coupled between the first current conducting terminal of transistor 820 and a first terminal of the shunt capacitor 842 (corresponding to the shunt capacitor 742 of FIG. 7). A low-pass matching inductive element 840 (corresponding to the low-pass matching inductor 740 of FIG. 7) is coupled between the output lead structure 804 and a first terminal of the low-pass matching capacitor 846 (corresponding to the low-pass matching capacitor 746 of FIG. 7). Second terminals of the capacitors 842, 846 are coupled to the flange 806 (e.g., to ground), with the capacitors 842, 846 being mounted on the flange 806 in the active device area. The capacitors 842, 846 can be, for example, discrete silicon capacitors, discrete ceramic capacitors, or other types of capacitors. In addition, the capacitors 842, 846 can be distinct from each other, or can be formed as an integrated discrete device (e.g., as shown in FIG. 8). Further, the bondwires corresponding to the inductive elements 834, 840 are attached to conductive top plates at the top surfaces of capacitors 842, 846. It also should be noted that the inductive coupling between the bondwires 832 and 834 is related to an area 841 underneath both sets of bondwires 832, 834 (e.g., the larger the area 841, the higher the inductive coupling, and vice versa). In order to reduce the area 841, the bondwires 832 are desirably as short as possible, while still ensuring that bondwires 832 are a reasonable distance above the bondwires 840. Essentially, the height of bondwires 840 determines the height of bondwires 832.

As for the envelope frequency matching circuit 749 of FIG. 7, structures corresponding to the resistor 738 and envelope capacitor 744 can be located in or on the isolation structure 808 of FIG. 8, rather than being located within the active device area. In other words, instead of being mounted on the flange 806 in the active device area, structures corresponding to the envelope resistor 738 and envelope capacitor 744 are located outside of the active device area, and are electrically coupled with the rest of the output impedance matching circuit (corresponding to the output impedance matching circuit 750) through additional conductive features. More specifically, in an embodiment in which the lead structures 802 and 804 are coupled to two opposed portions (or sides) of the four-sided (e.g., frame-shaped) isolation structure 808, it should be understood that the envelope resistor and envelope capacitor are located in or on two other opposed portions (or sides) of the isolation structure 808 (e.g., the envelope resistor and envelope capacitor are located on portions of the isolation structure 808 other than the portions to which the lead structures 802 and 804 are coupled). Described another way, when the isolation structure 808 is considered to have two lead-supporting portions (or sides) to which the lead structures 802, 804 are coupled, and two non-lead-supporting portions (or sides) to which the lead structures 802, 804 are not coupled (e.g., sides spanning between the lead-supporting portions or other portions of the isolation structure 808 that do not support the lead structures 802, 804), the envelope resistor and envelope capacitor are located in or on the two non-lead-supporting portions. That said, in an alternate embodiment, either or both of envelope resistor and/or envelope capacitor can be located in or on the lead-supporting portions of the isolation structure 808. In other alternate embodiments, only a single envelope resistor and/or envelope capacitor is included.

Further, in at least one embodiment, the device 800 also includes a conductive pad on a top surface of the isolation structure 808, and the conductive pad provides electrical connectivity between the envelope resistor (that is, the resistor 738 of FIG. 7) and the envelope inductive element (that is, the inductive element 736 of FIG. 7). More particularly, in at least one embodiment, the envelope inductive element is coupled between the first terminal of the capacitor 842 (or a conductive top plate at the top surface of the capacitor 842) and the aforementioned conductive pad on the top surface of the isolation structure 808. Further, it should also be appreciated that the RF cold point 748 of the circuit 700 shown in FIG. 7 is located at the first terminal of the capacitor structure 842 of FIG. 8. Also, the first terminal of the envelope resistor also is attached to the aforementioned conductive pad on the top surface of the isolation structure 808, and thus an electrical connection between the envelope inductive element and envelope resistor is established through that conductive pad. Additionally, a second terminal of the envelope resistor is coupled to a first terminal of the envelope capacitor.

According to various embodiments, the aforementioned envelope resistor (corresponding to the envelope resistor 738 of FIG. 7) is a thick or thin film resistor. Additionally, the envelope capacitor (corresponding to the envelope capacitor 744 of FIG. 7) can be, for example, a multiple-layer capacitor (e.g., a capacitor with multiple first plates coupled to a first terminal or plate on the top of the capacitor, and multiple second plates coupled to a second terminal or plate on the bottom of the capacitor, where the first and second plates are interdigitated or interleaved), in various embodiments. Also for example, in another embodiment, the envelope capacitor can be integrally formed with the isolation structure 808 (e.g., at least the portion of isolation structure 808 at which the envelope capacitor is located can be a multi-layer structure, with alternating conductive and dielectric layers of the isolation structure 808 forming envelope capacitor). Also, in at least some embodiments, the top conductive layer of the envelope capacitor in at least some embodiments is coupled to the second terminal of the envelope resistor, and the bottom conductive layer of the envelope capacitor is coupled to the flange 806.

Referring still to FIG. 8, the bottom conductive layer of the envelope capacitor can be coupled to the flange 806 through one or more conductive vias (not illustrated) extending between the bottom conductive layer of the envelope capacitor and the bottom surface of the isolation structure 808. More specifically, a second terminal of the envelope capacitor can be coupled to first ends of vias within the isolation structure 808, and second ends of vias at the bottom surface of the isolation structure 808 are coupled to the flange 806 (e.g., through the layer of metallization 880). Accordingly, the vias 1204 establish an electrical connection between the envelope capacitor and the flange 806 (e.g., ground). In an alternate embodiment, the vias can be replaced by edge plating or castellations (metallized castellations), which extend between the bottom layer of envelope capacitor and the bottom surface of the isolation structure 808 along a perimeter edge of isolation structure 808, where the edge plating or castellations provide an electrical connection between envelope capacitor and the flange 806.

As for the terminal impedance matching circuit 710 of FIG. 7, structures corresponding to the capacitor 760 and inductor 762 can be formed using the isolation structure 808 of FIG. 8. Referring to FIGS. 6, 8, and 12, the capacitor 760 can include an insulating layer (e.g., the layer 606) with the output lead 202 or conductive layer 805 functioning as the top capacitor electrode, and the tops of castellations 600, 1206 and vias 1204 (and/or an internal metallization layer 1208) functioning as the bottom capacitor electrode. The vias 1204 and/or castellations 1206 (and edge plating, in at least some embodiments) correspond to the inductor 762, which is coupled between capacitor 760 and ground (e.g., flange 806).

Further, as particularly represented by FIG. 12, in at least some embodiments, both the vias 1204 and edge plating or castellations 1206 are present. Further as also shown in FIG. 12, in at least some embodiments the vias 1204 and castellations 1206 are coupled internally by an internal metallization layer 1208 (shown in phantom). The vias 1204, castellations 1206, and metallization layer 1208 (and edge plating, when included) can be generally referred to herein as "conductive structures" in or on the frame structure 1200, which electrically couple the capacitor 760 to the conductive surface of the flange 806. Notwithstanding the above discussion, in another alternate embodiment in which the thickness of the isolation structure 808 is substantially equal to the thickness of envelope capacitor, the vias 1204 (or other conductive structures) can be eliminated, as the bottom layer of the envelope capacitor can be substantially co-planar with the bottom surface of the isolation structure 808.

It should be appreciated that an embodiment such as that of FIG. 8 is advantageous in that the discrete components associated with the envelope frequency termination circuit 749 (specifically envelope resistor and envelope capacitor) are not located within the active device area. Instead, these elements are located outside the active device area (specifically in or on the isolation structure 808). Accordingly, more space is available for active devices within the active device area, and/or the active device area (and thus the device 800 can have a relatively small size). Also, in alternate embodiments, portions of the input impedance matching circuit 118 can be located on the isolation structure 808, and/or portions of the output impedance matching circuit 750 can be located on the isolation structure 808. In still other embodiments, the envelope capacitor and/or the envelope resistor (again respectively corresponding to the resistor 738 and capacitor 744) can be implemented using differently configured components.

Figure 9:
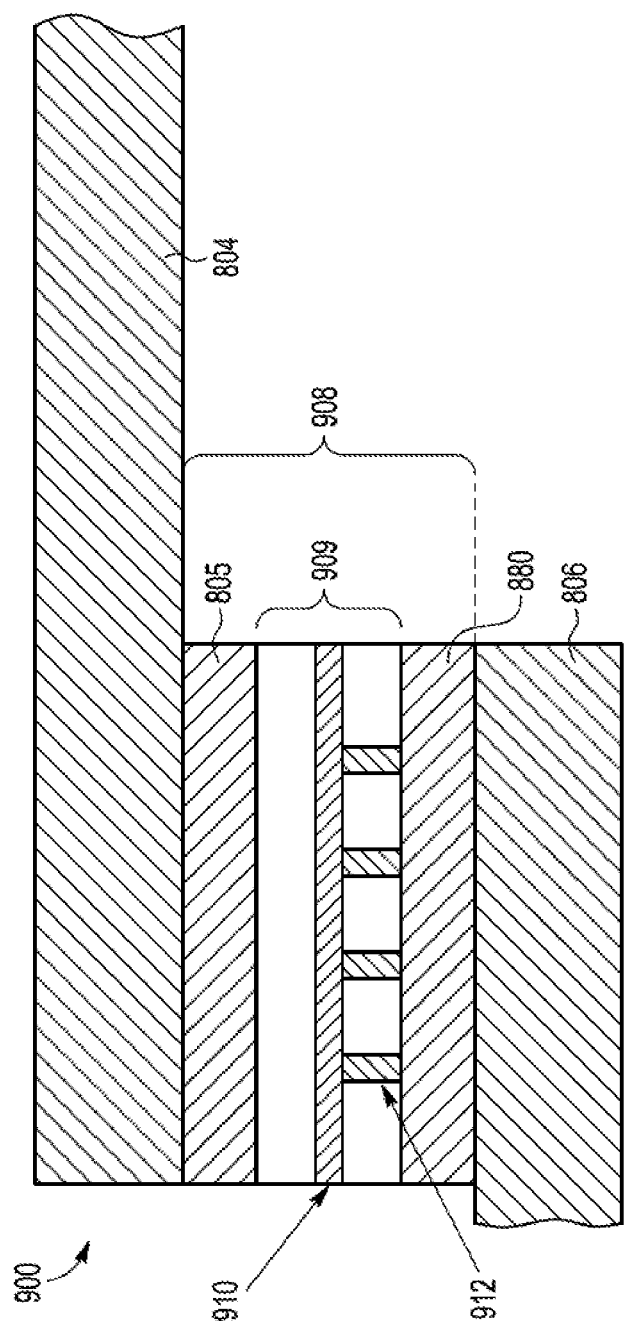
FIGS. 9, 10, and 11 illustrate, in the form of detail views of a portion of FIG. 7, different example arrangements of castellations and/or vias that can be employed in different varying embodiments of the semiconductor device structure of FIG. 8.
Figure 10:
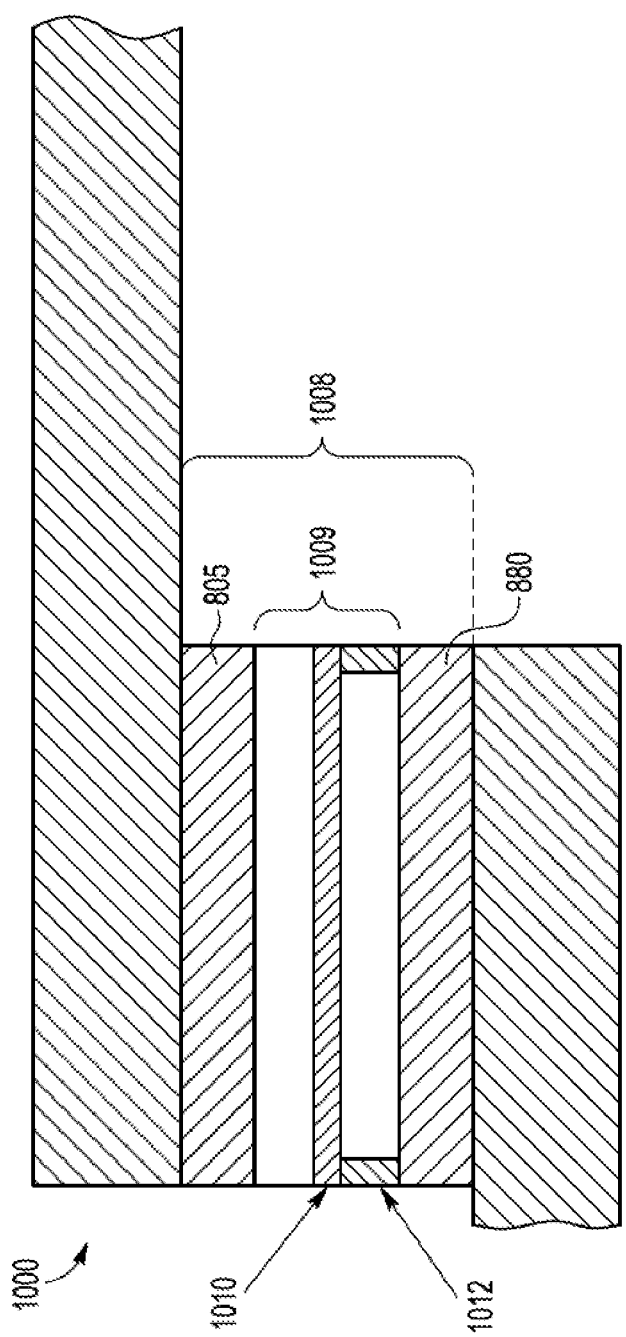
Figure 11:
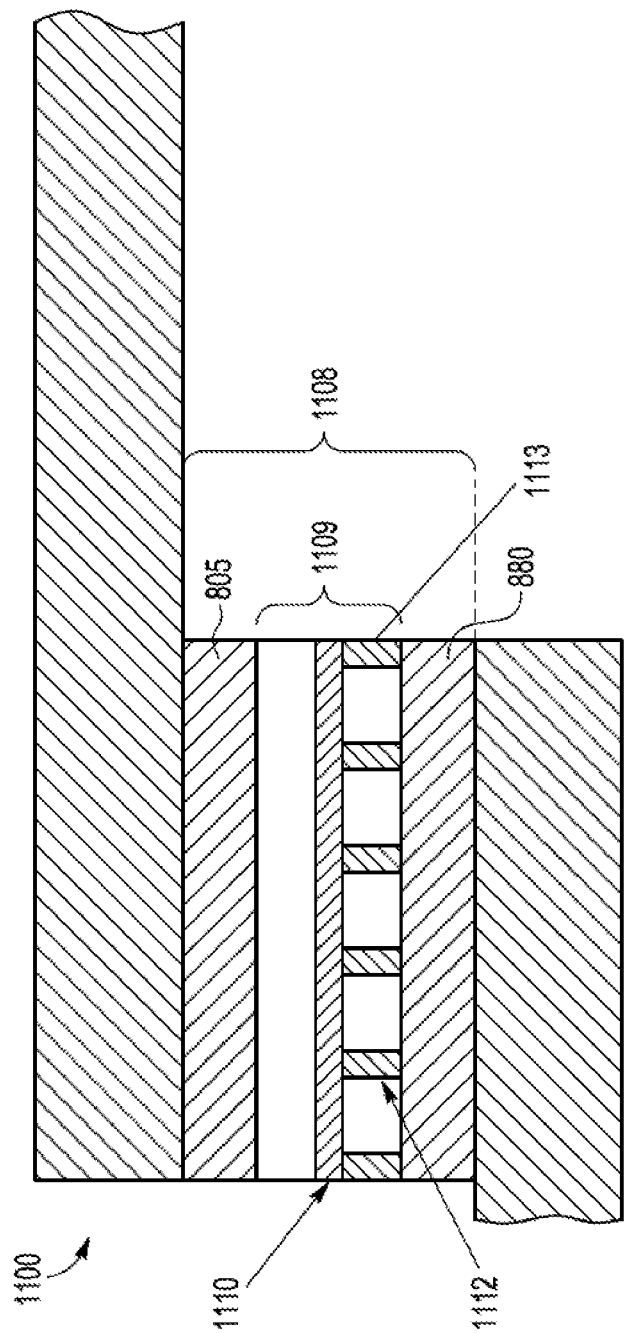

Turning to FIGS. 9, 10, and 11, detail views are provided of three different embodiments of a portion 899 of the device 800 of FIG. 8, where the portion 899 particularly includes a section of the isolation or frame structure 808, and where each of the different embodiments particularly includes different arrangements of conductive structures. FIG. 9 particularly shows a cross-sectional view of a portion 900 corresponding to the portion 899 of FIG. 8, in which an isolation structure 908 positioned between the output lead structure 804 and the flange 806 includes the layer of metallization 805 in contact with the output lead structure 804, a layer of metallization 880 contacting the flange 806, and a region 909 between those two layers. Further, in this embodiment, the isolation structure 908 also includes an internal metallization layer 910 corresponding to the metallization layer 1208 of FIG. 12 that extends within the interior of the region 909 between the metallization 805 and metallization 880 (in some embodiments, the positioning of the layer 910 can be midway between the metallization 805 and metallization 880), as well as multiple vias 912 extending from the internal metallization layer 910 through the region 909 to the metallization 880 so as to be electrically coupled (short-circuited) to the flange 806. The vias 912 in this embodiment are filled with metal, such that the metallization layer 910 is short-circuited to the flange 806.

By comparison, FIG. 10 particularly shows a cross-sectional view of a portion 1000 corresponding to the portion 899 of FIG. 8, in which an isolation structure 1008 positioned between the output lead structure 804 and the flange 806 includes the layer of metallization 805 in contact with the output lead structure, a layer of metallization 880 contacting the flange 806, and a region 1009 between those two layers. Further, in this embodiment, the isolation structure 1008 also includes an internal metallization layer 1010 corresponding to the metallization layer 1208 of FIG. 12 that extends within the region 1009 approximately midway between the metallization 805 and metallization 880, as well as multiple metallized castellations 1012 extending from the metallization layer 1010 through the region 1009 and to metallization 880 to electrically contact the flange 806. The castellations 1012 in this embodiment are filled with metal, such that the metallization layer 1010 is short-circuited to the flange 806. Further, FIG. 11 particularly shows a cross-sectional view of a portion 1100 corresponding to the portion 899 of FIG. 8, in which an isolation structure 1108 positioned between the output lead structure 804 and the flange 806 includes the layer of metallization 805 in contact with the output lead structure, a layer of metallization 880 contacting the flange 806, and a region 1109 between those two layers. Further, in this embodiment, the isolation structure 1108 includes an internal metallization layer 1110 corresponding to the metallization layer 1208 of FIG. 12 that extends within the region 1109 approximately midway between the metallization 805 and metallization 880, as well as both multiple vias 1112 filled with metal and multiple metallized castellations 1113, where each of the vias and castellations extends from the metallization layer 1110 through the region 1109 to metallization 880 to electrically contact the flange 806. Since each of the vias 1112 and castellations 1113 in this embodiment are filled with metal, again the metallization layer 1110 is short-circuited to the flange 806 (as was the case with the metallization layers 910 and 1010).

With respect to each of FIGS. 9, 10, and 11, in each case it should be appreciated that each of the isolation structures 908, 1008, and 1108 is a modified version of the isolation structure 808 of FIG. 8 in which the isolation structure has been modified to create a capacitor with a thinner dielectric layer by adding a ground plane metallization (e.g., the metallization layers 910, 1010, and 1110) and connecting that metallization to the metallization layer 880 contacting the flange 806 by way of one or more of the vias 912, 1112, and/or castellations 1012, 1113 (which can also in some cases include edge plating), that is, by way of one or both of vias and/or castellations. Also it should be appreciated that one or more embodiments encompassed herein, including but not limited to those described above, can provide any one or more of a number of advantages. For example, in at least some embodiments, the impedance transformation and/or envelope termination can be provided at significantly lower cost than in conventional embodiments, through the use of off the shelf components and/or for other reasons. Also, in at least some embodiments encompassed by the present disclosure, bond back capacitors are completely eliminated from the semiconductor device/circuit. Further, the present disclosure is also intended to encompass methods of manufacturing circuits, semiconductor devices, and/or packages having any one or more of the circuits, components, and/or features described herein or encompassed herein.

Further for example, in at least some embodiments, the present disclosure relates to a semiconductor device. The semiconductor device includes a radio frequency (RF) power transistor having a first port, a second port, and a third port. The semiconductor device also includes an output lead, a first output impedance matching circuit between the second port and the output lead, and a first additional circuit coupled between the output lead and a ground terminal. At least one component of the first additional circuit is formed at least in part by way of one or more of a plurality of castellations and a plurality of vias.

Also, in at least some embodiments, the semiconductor device includes both the first additional circuit and a second additional circuit, where the second additional circuit is coupled either between the first port and the ground terminal or between a portion of the output impedance matching circuit and the ground terminal. Also, in at least some embodiments, the output impedance matching circuit includes an inductive element and a capacitor coupled in series between the second port and the ground terminal, and the portion of the output impedance matching circuit is a node linking the inductive element and the capacitor. Further, in at least some embodiments, the semiconductor device also includes a third additional circuit that is coupled between the first port and ground terminal, where each of the second additional circuit and the third additional circuit is configured to perform envelope termination. Additionally, in at least some embodiments each of the second additional circuit and the third additional circuit includes a respective series combination of a respective further inductive element, a respective resistor, and a respective further capacitor.

Additionally, in at least some embodiments, the first additional circuit includes a series combination of an inductive element and a capacitor. Further, in at least some embodiments, the first output impedance matching circuit includes a first inductive element coupled between the second port and the output port, a second inductive element coupled between the second port and a node, and a further capacitor coupled between the node and the ground terminal. Also, in at least some embodiments, the semiconductor device further comprises an input port, first and second additional inductive elements coupled in series between the input port and the first port, and an additional capacitor coupled between the ground terminal and an additional node between the input port and the first port.

Further, the present disclosure also includes, in at least some embodiments, a package. The package includes a substrate having a conductive surface, and an isolation structure having a top surface and a bottom surface coupled to the conductive surface of the substrate, where the isolation structure includes an opening, and an active device area is defined by a portion of the conductive surface of the substrate that is exposed through the opening. The package also includes a transistor coupled to the conductive surface of the substrate within the active device area, a first lead coupled to the isolation structure, and a circuit electrically coupled between the transistor and the first lead, where the circuit includes a plurality of elements, and where one or more elements of the plurality of elements is positioned outside the active device area. The package additionally includes either a plurality of metallized castellations or a plurality of metallized vias extending through at least a portion of the isolation structure, where at least one of the elements is formed at least in part by way of the plurality of metallized castellations or the plurality of metallized vias.

Also, in at least some embodiments, the first lead is an output lead, the circuit is an output circuit coupled between a current conducting terminal of the transistor and the output lead, and the one or more elements positioned outside the active device area are physically coupled to or formed at least in part by the isolation structure. Further, in at least some embodiments, the package comprises both the plurality of metallized castellations and the plurality of metallized vias. Also, in at least some embodiments, the isolation structure includes a first metallization layer that forms the bottom surface of the isolation structure and is in contact with the conductive surface of the substrate, and a second metallization layer that extends substantially parallel to the first metallization layer in between the top and bottom surfaces of the isolation structure, where the first and second metallization layers are short-circuited to one another by either the plurality of metallized castellations or the plurality of metallized vias.

Further, in at least some embodiments, the one or more elements positioned outside the active device area include both first elements that at least in part form a first additional circuit that is configured to perform an envelope frequency termination operation and second elements that at least in part form a second additional circuit that is configured to perform an impedance matching operation. Also, in at least some embodiments, the package further includes additional elements coupled between a control terminal of the transistor, the additional elements forming a third additional circuit that is configured to perform a gate side envelope termination operation. Further, in at least some embodiments, each of the first elements, the second elements, and the additional elements includes at least one respective inductive element and at least one respective capacitor. Also, in at least some embodiments, the transistor is a radio frequency (RF) power amplifier. Further, in at least some embodiments, the transistor is a field-effect-transistor (FET). Additionally, in at least some embodiments, the package further includes one or both of a cap to seal interior components within an air cavity, and molding compound that encompasses at least some components within the active device area.

Additionally, the present disclosure also is intended to encompass, in at least some embodiments, a method of manufacturing a semiconductor device. The method includes providing a substrate having a surface. The method also includes forming an isolation structure that includes a first metallization layer, an internal metallization layer, and either a plurality of metallized vias or a plurality of metallized castellations linking the internal metallization layer with the first metallization layer. The method further includes coupling a bottom surface of the isolation structure to the surface of the substrate, where the isolation structure includes an opening, and an active device area is defined at least in part by a portion of the surface of the substrate that is exposed through the opening. The method also includes coupling an active device to the surface of the substrate within the active device area, coupling a lead to the isolation structure, and electrically coupling a circuit between the active device and the lead, where the circuit includes a plurality of elements, where one or more elements of the plurality of elements is positioned outside the active device area, and where at least one of the elements is formed at least in part by way of the plurality of metallized vias or plurality of metallized castellations. Further, in at least some such embodiments, electrically coupling the circuit between the active device and the lead includes physically coupling the one or more elements positioned outside the active device area to the isolation structure, and the one or more elements positioned outside the active device area include elements configured to perform either an envelope frequency termination operation or an impedance matching operation.

It should be noted that the connecting lines shown in the various figures contained herein are intended to represent exemplary functional relationships and/or physical couplings between the various elements. Also, it should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context. Further, as used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node). Additionally, although the schematics shown in the figures depict certain example arrangements of elements, additional intervening elements, devices, features, or components can be present in other embodiments of the depicted subject matter.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:
1. A package comprising:
a substrate having a conductive surface;

an isolation structure having a top surface and a bottom surface coupled to the conductive surface of the substrate, wherein the isolation structure includes
an opening, and an active device area is defined by a portion of the conductive surface of the substrate that is exposed through the opening,
a first metallization layer that forms the top surface of the isolation structure;
a second metallization layer that forms the bottom surface of the isolation structure and is in contact with the conductive surface of the substrate and
at least one of a plurality of metallized castellations and a plurality of metallized vias that extend from the second metallization layer through a portion of the isolation structure;
a transistor coupled to the conductive surface of the substrate within the active device area;
an output lead coupled to the first metallization layer of the isolation structure and to a current conducting terminal of the transistor; and
an output circuit positioned between and electrically coupled between the current conducting terminal of the transistor and the output lead,
wherein the output circuit includes a plurality of elements, and one or more of the plurality of elements is positioned outside the active device area and formed at least in part by at least one of the plurality of metallized castellations and the plurality of metallized vias.

2. The package of claim 1, wherein the package comprises both the plurality of metallized castellations and the plurality of metallized vias.

3. The package of claim 1, wherein the isolation structure includes a third metallization layer that extends substantially parallel to the first metallization layer inbetween the top and bottom surfaces of the isolation structure, and the second and third metallization layers are short-circuited to one another by at least one of the plurality of metallized castellations or the plurality of metallized vias.

4. The package of claim 1, further comprising a first and a second additional circuit, each of said additional circuits comprising one or more elements positioned outside the active device area and physically coupled to or formed at least in part by the isolation structure, the first additional circuit configured to perform an envelope frequency termination operation and the second additional circuit configured to perform an impedance matching operation.

5. The package of claim 4, further comprising additional elements coupled between a control terminal of the transistor, the additional elements forming a third additional circuit that is configured to perform a gate side envelope termination operation.

6. The package of claim 5, wherein the one or more elements of each of the first second and third additional circuits includes at least one inductive element and at least one capacitor.

7. The package of claim 6, wherein the transistor is a radio frequency (RF) power amplifier.

8. The package of claim 7, wherein the transistor is a field-effect-transistor (FET).

9. The package of claim 8, further comprising one or both of a cap to seal interior components within an air cavity, and molding compound that encompasses at least some components within the active device area.

10. A method of manufacturing a semiconductor device, the method comprising the steps of:
providing a substrate having a surface;
forming an isolation structure that includes a first metallization layer, an internal metallization layer, and at least one of a plurality of metallized vias and a plurality of metallized castellations linking the internal metallization layer with the first metallization layer;
coupling a bottom surface of the isolation structure to the surface of the substrate, wherein the isolation structure includes an opening, and an active device area is defined at least in part by a portion of the surface of the substrate that is exposed through the opening;
coupling an active device to the surface of the substrate within the active device area;
coupling an output lead to the isolation structure and to the active device; and
electrically coupling an output circuit between the active device and the output lead, wherein the output circuit includes a plurality of elements, one or more of the plurality of elements is positioned outside the active device area, and at least one of the plurality of elements is formed at least in part by at least one of the plurality of metallized vias and the plurality of metallized castellations.

11. The method of claim 10, wherein electrically coupling the output circuit between the active device and the output lead includes physically coupling the one or more of the plurality of elements positioned outside the active device area to the isolation structure, and wherein the one or more of the plurality of elements positioned outside the active device area include elements configured to perform either an envelope frequency termination operation or an impedance matching operation.

12. A package comprising:
a substrate having a conductive surface;
an isolation structure having a top surface and a bottom surface coupled to the conductive surface of the substrate, wherein the isolation structure includes
an opening, and an active device area is defined by a portion of the conductive surface of the substrate that is exposed through the opening;
a first metallization layer that forms the top surface of the isolation structure;
a second metallization layer that forms the bottom surface of the isolation structure and is in contact with the conductive surface of the substrate and
at least one of a plurality of metallized castellations and a plurality of metallized vias that extend from the second metallization layer through a portion of the isolation structure;
a radio frequency (RF) power amplifier transistor coupled to the conductive surface of the substrate within the active device area, the transistor having a first port, a second port, and a third port;
an output lead coupled to the first metallization layer of the isolation structure and to the second port of the transistor;
a first output impedance matching circuit electrically coupled between the second port of the transistor and the output lead; and
a first additional circuit coupled between the output lead and a ground terminal, wherein at least one component of the first additional circuit is formed at least in part by at least one of the plurality of metallized castellations and the plurality of metallized vias.

13. The package of claim 12, comprising a second additional circuit coupled either between the first port of the transistor and the ground terminal, or between a portion of the first output impedance matching circuit and the ground terminal.

14. The package of claim 13, wherein the first output impedance matching circuit includes an inductive element and a capacitor coupled in series between the second port of the transistor and the ground terminal, and said portion of the first output impedance matching circuit is a node linking the inductive element and the capacitor.

15. The package of claim 13, further comprising a third additional circuit that is coupled between the first port of the transistor and the ground terminal, wherein each of the second additional circuit and the third additional circuit is configured to perform envelope termination.

16. The package of claim 15, wherein each of the second additional circuit and the third additional circuit includes a respective series combination of a respective further inductive element, a respective resistor, and a respective further capacitor.

17. The package of claim 13, wherein the first additional circuit includes a series combination of an inductive element and a capacitor.

18. The package of claim 17, further comprising an outport port, wherein the first output impedance matching circuit includes a first inductive element coupled between the second port of the transistor and the output port, a second inductive element coupled between the second port of the transistor and a node, and a further capacitor coupled between the node and the ground terminal.

19. The package of claim 18, further comprising an input port, first and second additional inductive elements coupled in series between the input port and the first port of the transistor, and an additional capacitor coupled between the ground terminal and an additional node between the input port and the first port of the transistor.

* * * * *